(12) United States Patent
Chan et al.

(10) Patent No.: US 8,639,952 B1
(45) Date of Patent: Jan. 28, 2014

(54) FIELD-PROGRAMMABLE GATE ARRAY HAVING VOLTAGE IDENTIFICATION CAPABILITY

(75) Inventors: Vei-Han Chan, San Jose, CA (US); Louis Charles Kordus, II, Sunnyvale, CA (US)

(73) Assignee: Agate Logic, Inc., Santa Clara, CA (US)

( * ) Notice: Subject to any disclaimer, the term of this patent is extended or adjusted under 35 U.S.C. 154(b) by 1026 days.

(21) Appl. No.: 11/716,265

(22) Filed: Mar. 9, 2007

(51) Int. Cl.
*G06F 1/26* (2006.01)

(52) U.S. Cl.
USPC .......................................................... 713/300

(58) Field of Classification Search
USPC .......................................................... 713/300
See application file for complete search history.

(56) References Cited

U.S. PATENT DOCUMENTS

| | | | | |
|---|---|---|---|---|
| 6,314,522 B1 * | 11/2001 | Chu et al. | ....................... | 713/322 |
| 6,803,787 B1 * | 10/2004 | Wicker, Jr. | ....................... | 326/46 |
| 6,952,748 B1 * | 10/2005 | Guerrero et al. | ............. | 710/113 |
| 6,957,163 B2 * | 10/2005 | Ando | ............................ | 702/130 |
| 7,028,281 B1 * | 4/2006 | Agrawal et al. | ................ | 716/12 |
| 7,164,307 B2 * | 1/2007 | Tschanz et al. | ............... | 327/534 |
| 7,180,813 B2 * | 2/2007 | Matarrese et al. | ........... | 365/226 |
| 7,363,523 B2 * | 4/2008 | Kurts et al. | .................... | 713/320 |
| 2004/0128090 A1 | 7/2004 | Read et al. | | |
| 2004/0128566 A1 | 7/2004 | Burr et al. | | |
| 2004/0128567 A1 | 7/2004 | Stewart | | |
| 2005/0225376 A1 * | 10/2005 | Kin Law | ...................... | 327/534 |

* cited by examiner

*Primary Examiner* — Kim Huynh
*Assistant Examiner* — Eric Chang
(74) *Attorney, Agent, or Firm* — James M. Wu; JW Law Group

(57) ABSTRACT

A programmable logic device (PLD) provides voltage identification (VID) codes to a voltage regulator module having VID capabilities. The voltage regulator module generates supply Vdd and/or body bias Vbb voltages according to a selected VID code. The value of the supply Vdd and/or body bias Vbb voltages generated and applied to the PLD determine the operating characteristics of the PLD. The VID codes can be provided and stored in various ways: by an addressable lookup table (LUT) integrated with the PLD, by a memory device in which the VID codes are transferred from an external memory. The VID codes may also be self-generated by auto-detect circuitry integrated with the PLD. The ability to select a particular VID code for each individual PLD allows the user to optimize operational characteristics of the device to satisfy power and/or performance requirements.

43 Claims, 11 Drawing Sheets

| Vdd level | Vbb level | Performance level | Power level |
|---|---|---|---|
| $Vdd_1$ | $Vbb_1$ | $Perf_{11}$ | $Power_{11}$ |
| ⋮ | ⋮ | ⋮ | ⋮ |
| $Vdd_n$ | $Vbb_1$ | $Perf_{n1}$ | $Power_{n1}$ |
| $Vdd_1$ | $Vbb_2$ | $Perf_{12}$ | $Power_{12}$ |
| ⋮ | ⋮ | ⋮ | ⋮ |
| $Vdd_n$ | $Vbb_2$ | $Perf_{n2}$ | $Power_{n2}$ |
| ⋮ | ⋮ | ⋮ | ⋮ |
| ⋮ | ⋮ | ⋮ | ⋮ |
| $Vdd_1$ | $Vbb_m$ | $Perf_{1m}$ | $Power_{1m}$ |
| ⋮ | ⋮ | ⋮ | ⋮ |
| $Vdd_n$ | $Vbb_m$ | $Perf_{nm}$ | $Power_{nm}$ |

FIGURE 8

FIELD-PROGRAMMABLE GATE ARRAY HAVING VOLTAGE IDENTIFICATION CAPABILITY

FIELD OF THE INVENTION

The present invention relates to performance and power consumption of integrated circuits. More specifically, the present invention relates to systems and methods for setting and/or controlling the performance and power consumption characteristics of integrated circuits using voltage identification techniques.

BACKGROUND OF THE INVENTION

Advances in integrated circuit technology have progressed dramatically since the integrated circuit (IC) was first successfully implemented in the early 1960s. Improvements in equipment and refinements in processing techniques have allowed the fabrication of ever smaller and more densely packed ICs. For example, while IC feature sizes of a few microns were once considered extraordinary, state of the art technologies are now capable of producing ICs having nanometer scale feature sizes. The ability to scale feature sizes of an IC to smaller dimensions is beneficial since it increases the possible operating speed, reduces power consumption, and lowers the cost per IC unit.

Although scaling provides many benefits, the physical features of an IC become more sensitive to process variations the more the IC is scaled. Physical variations translate into variations in power and performance of the same design among lots, wafers and dies. Significant variations in power and performance are undesirable, since they result in wide deviations in intended circuit performance. The variations also adversely affect the desired yield. While transistors and circuits on smaller scale ICs do not always show significant power and performance variations among dies, such variations can be significant in very large scale integrated (VLSI) circuits. Indeed, variations in performance and power consumption of transistors and other devices within a single VLSI die (i.e., "within-die" variations) can become significant when scaling is pushed to its limits.

Various techniques have been proposed to reduce the impact of process variations on device performance and power consumption. One approach that helps to tighten the distribution of maximum operating frequency $f_{max}$ (a measure of device performance) and maximum power consumption $P_{max}$ among dies, and thereby improve yield, is to apply an "adaptive body bias" (ABB) to the bodies of the IC transistors during operation. Applying an ABB adjusts the threshold voltage of the transistors of the IC in a manner that narrows the distribution of operating frequency and power among dies. A primary drawback of the ABB approach, however, is that additional power distribution networks must be patterned on the dies in order to route the body voltages to the many transistors of the IC. These additional routing resources consume valuable silicon area and add to the overall cost of the IC.

Another technique that addresses the impact of process variations on scaled ICs is the "adaptive supply voltage" (ASV) approach. Similar to the ABB approach, the ASV approach adjusts the supply voltage to the integrated circuit with the object of satisfying predetermined performance and power specifications. An added benefit of the ASV approach over the ABB approach is that no additional power distribution resources are needed to route the supply voltage. In some applications, ASV is applied dynamically, so that power consumption can be decreased or increased depending on a set of timing constraints. This dynamic ASV approach has been shown to be useful in microprocessor chips, where the supply voltage of the microprocessor is dynamically adjusted by built-in firmware or circuitry to conserve power during times when the microprocessor is idle and to increase power during times when the microprocessor is executing a large number of instructions.

While the ABB and ASV approaches do help in improving the yield of scaled ICs, an end user has little control over the performance and power consumption of the product. Typically an end user is provided with only a discrete set of frequency or power consumption specifications (e.g., min, max, nominal) for a given class of products, and corresponding supply voltage ranges that will guarantee that the discrete specifications for products within the class are satisfied. Application of ABB or ASV may then be applied to ensure that products within the class operate somewhere within the bounds of the minimum and maximum specifications.

The prior art methods of providing discrete performance and power consumption specifications, and applying ABB or ASV, do help to ensure that an IC will operate properly somewhere within the specified performance and power limits. However, because the specifications cover a group or class of parts having varying performance and power consumption characteristics, an end user is not provided the flexibility or necessary information to optimize the performance and power consumption of an individual end product, i.e., on a part-by-part basis. Instead, the user is only ensured that a given part will operate somewhere between the minimum and maximum specifications. Further, whereas application of an ABB or ASV does help to ensure that parts from within the given group or class of parts operate within certain specified performance and power ranges, neither of the approaches provides the user the necessary means to ensure that the supply Vdd and/or body bias Vbb voltages applied to any particular part results in optimized or predetermined power consumption and performance.

BRIEF SUMMARY OF THE INVENTION

Methods, systems and apparatus for setting and controlling the power level and/or operating frequency of an integrated circuit are disclosed. According to one exemplary embodiment of the invention, a system includes a programmable logic device such as, for example, a field programmable gate array (FPGA) and a voltage regulator module with voltage identification (VID) capabilities. The programmable logic device is operable to provide a plurality of VID codes corresponding to a plurality of power levels and/or operating frequencies at which the programmable logic device can be set to operate. The voltage regulator module is operable to generate supply and/or body bias voltages, based on one or more selected VID codes, and provide the generated supply and/or body bias voltages to supply and/or body bias inputs of the programmable logic device.

Various examples as to how the VID codes are generated and provided to the voltage regulator module are described. According to one aspect of the invention, the VID codes are provided by an addressable lookup table (LUT) integrated with the programmable logic device. The LUT may be addressed by an addressing source that is integrated with the programmable logic device or by an external addressing source. According to another aspect of the invention, the VID codes are transferred from an external memory (e.g., from a preconfiguration stream of an external configuration memory) to storage elements within the programmable logic device. In yet another embodiment, an auto-detect circuit integrated with the programmable logic device measures power and performance (e.g., operating frequency) characteristics of the programmable logic device as a function of different values of supply and/or body bias voltages that can be applied to the programmable logic device. The measurements are then used to generate VID codes for the voltage regulator module.

Methods and apparatus are also disclosed which provide a user the ability to select from among a plurality of available VID codes. The ability to select a particular VID code for each individual programmable logic device allows power and/or performance to be optimized on a part-by-part basis.

Further features and advantages of the present invention, as well as the structure and operation of various embodiments of the present invention, are described in detail below with respect to accompanying drawings, in which like reference numbers are used to indicate identical or functionally similar elements.

BRIEF DESCRIPTION OF THE DRAWINGS

FIG. 8 is an exemplary performance/power table, as functions of Vdd and Vbb, which may be generated using the management module circuit in FIG. 2, in accordance with an embodiment of the present invention;

DETAILED DESCRIPTION OF THE INVENTION

Figure 1:
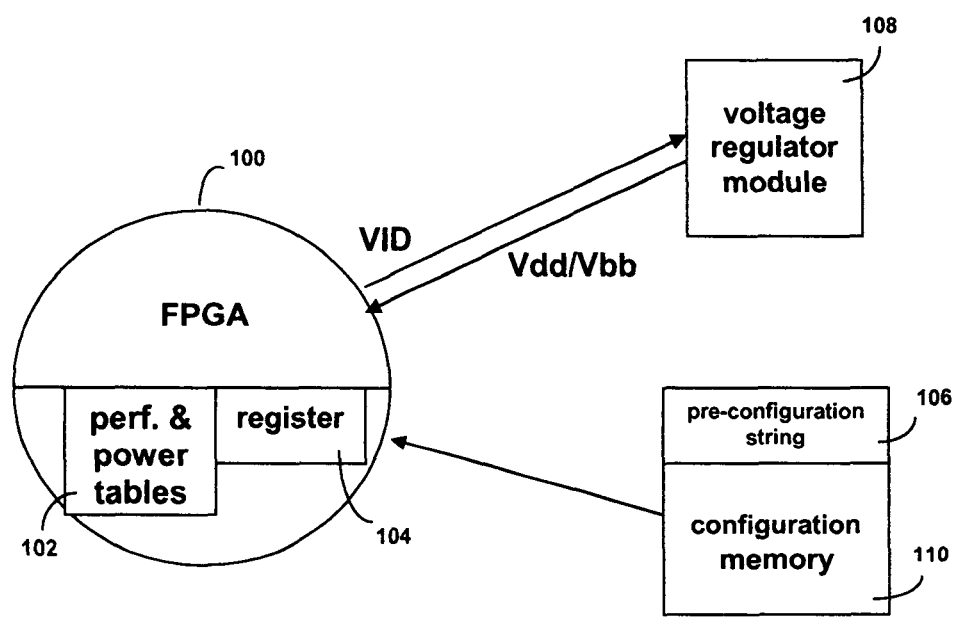
FIG. 1 is block diagram of a system for setting and controlling the power and/or performance characteristics of a field-programmable gate array (FPGA) using a voltage identification (VID) controlled voltage regulator module, according to an embodiment of the present invention.

Referring to FIG. 1, there is shown a block diagram of a system for setting and controlling the power and/or performance (e.g., operating frequency) of an integrated circuit using a voltage identification (VID) controlled voltage regulator module, according to an embodiment of the present invention. The integrated circuit in this and other exemplary embodiments disclosed herein comprises a field-programmable gate array (FPGA) 100. However, those of ordinary skill in the art will readily appreciate and understand that the concepts and features of the inventions disclosed herein may similarly apply to other types of integrated circuits, including other types of programmable logic devices (PLDs) and other nonprogrammable integrated circuits.

The FGPA 100 includes, along with its programmable logic devices, a plurality of storage elements configured to store a performance/power table 102 and a plurality of registers 104 having inputs that are optionally adapted to receive a preconfiguration stream 106 from an external configuration memory 110. Outputs of one or more of the registers 104 are coupled to N VID output buffers of the FGPA 100, where N is an integer greater than or equal to one. The N VID output buffers are coupled to respective VID output pins, which are adapted to be coupled to N VID input pins of a voltage regulator module 108.

The signals provided from the VID output buffers of the FPGA 100 to the VID inputs of the voltage regulator module 108 are digital, meaning that they have either a logic high value or a logic low value. Accordingly, the N VID output buffers of the FGPA 100 are capable of providing $2^N$ unique signals to the VID inputs of the voltage regulator 108, which is then capable of generating and supplying $2^N$ unique values of supply voltages Vdd to the FPGA 100. Similar circuitry can be used to provide various different values of body bias voltages Vbb. How the binary values of each of the N VID codes and signals are set, selected and accessed are described in more detail below.

Because the FPGA 100 does not have any fixed functionality prior to it being programmed, the VID control codes necessary to effect and guarantee specific performance and power characteristics may be determined after a user has determined the functional implementation of the FPGA 100, or has programmed the FPGA 100 to perform the determined functional implementation. Nevertheless, performance and power tables as functions of Vdd and/or Vbb may be generated by the manufacturer, tester, designer or distributor of the FPGA before or after the FPGA 100 has been fabricated, and either prior to or after the end user has determined or programmed a particular design implementation. For example, the manufacturer, tester or designer may generate a performance and power table based on implementation specifications provided by the end user. As explained in more detail below, codes representing the various performance and power entries in the table may be stored within storage elements of the FPGA 100 or outside the FGPA, e.g., in digital data files or in paper form (e.g., as provided from the manufacturer, designer, tester or distributor of the FPGA).

Figure 2:
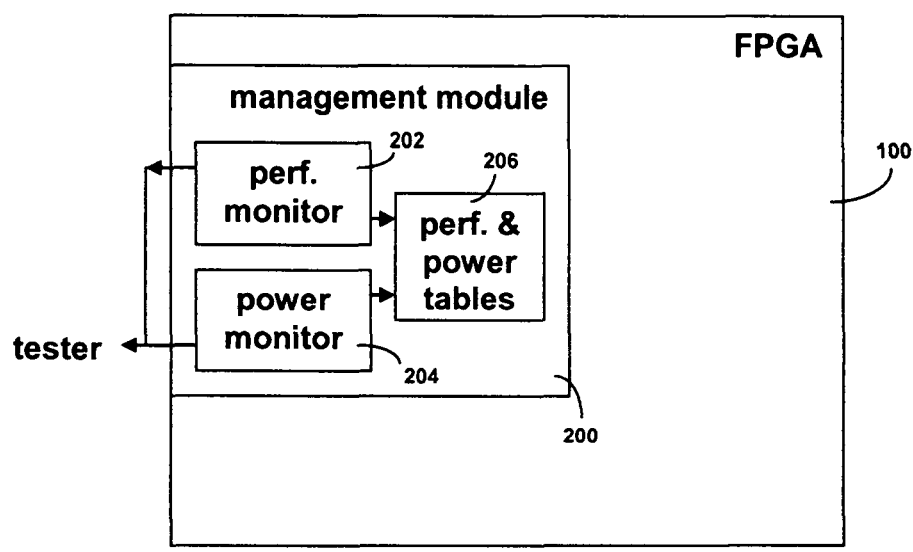
FIG. 2 is a block diagram of an FPGA having a management module circuit, which can be used to generate a performance and power table for the FPGA, according to an embodiment of the present invention.

According to an aspect of the invention, a test algorithm implemented in test equipment or a management module circuit within the FPGA 100 itself may be used to generate a performance and power table for the FPGA 100. FIG. 2 is a block diagram of an FPGA 100 having a management module circuit 200, which can be used to generate such a performance and power table. The management module circuit 200 comprises a performance monitor circuit 202, a power monitor circuit 204, and a power/performance table 206. The performance monitor circuit 202 is operable to determine the performance (e.g., speed) of the FPGA 100 as a function of different supply Vdd and/or body bias Vbb voltages applied to the FPGA 100. The power monitor circuit 204 is operable to determine the power consumption of the FPGA 100 as a function of different supply Vdd and/or body bias Vbb voltages. The results of these tests may be stored in the table 206, with each entry in the table 206 represented by a corresponding VID control code for controlling the voltage regulator module 108. Entries in the table can be permanently set, e.g., during manufacturing test. Alternatively, the performance and/or power monitor circuits 202, 204 can be dynamically applied during device operation, to monitor and adjust for changes in device characteristics over time (e.g., due to intrinsic degradation of device characteristics as the device operates over its lifetime). In this manner, the most appropriate settings of Vdd and/or Vbb needed to satisfy a desired performance and/or power requirement can be monitored and adjusted accordingly as the device ages. This ability to adjust and update power and performance settings not only avoids reliability risks caused by device degradation over time, it also allows manufacturing guardbands, which are used to compensate for lifetime degradation, to be reduced.

Figure 3:
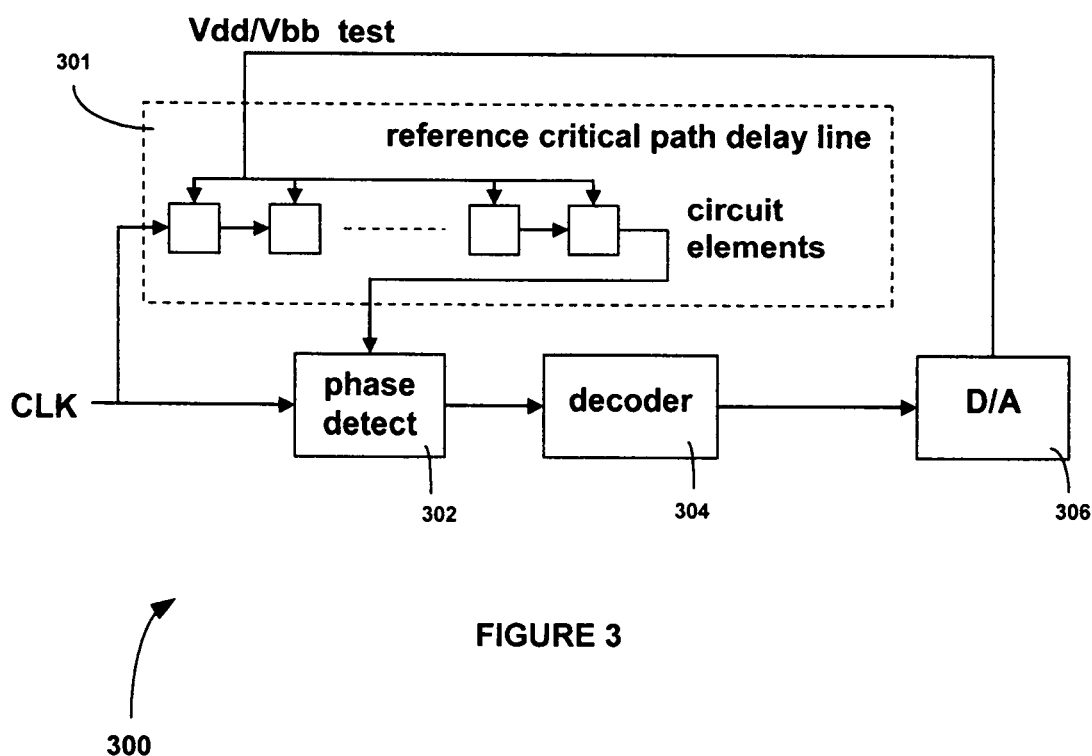
FIG. 3 is a diagram of an exemplary performance monitor circuit, which may be used to implement the performance monitor circuit of the management module circuit in FIG. 2, in accordance with an embodiment of the present invention.

FIG. 3 is a diagram of an exemplary performance monitor circuit 300, which may be used to implement the performance monitor circuit 202 of the management module circuit 200 in FIG. 2. According to this aspect of the invention, the performance monitor circuit 300 determines the performance of the FGPA 100 for various supply Vdd and/or body bias Vbb voltages using a delay-locked loop (DLL), by collecting performance data on a reference critical path (CP) circuit 301 in the FPGA 100. The performance monitor circuit 300 comprises a phase detect circuit 302 having an input configured to receive a clock signal CLK, a decoder 304 having an input configured to receive a phase detect output signal from the phase detect circuit 302, and a digital to analog (D/A) converter 306 configured to receive a decoded digital signal from the decoder 304 and convert the decoded digital signal to an analog signal for the reference CP circuit 301.

During operation a CLK signal having a predetermined frequency is applied to the input of the phase detect circuit 302 and also to an input of the reference CP circuit 301. The phase detect circuit 302 compares the CLK signal to an output of the reference CP circuit 301 to determine a phase difference between the two signals and generate a phase detect signal, which is used to drive the decoder 304. In response to the phase detect signal, the decoder 304 provides a digital output signal having a value representing the desired voltage levels (i.e., desired Vdd and/or Vbb). This digital output signal is then converted into an analog voltage (or analog voltages if Vbb is also used) and fed back to supply inputs of the reference CP circuit 301 to complete the DLL.

If a clock edge of the delayed version of the CLK signal applied to the reference CP circuit 301 lags or leads the a clock edge of the CLK signal applied directly to the phase detect circuit 302, the decoder 304 provides a digital signal to the D/A converter 306 that causes the D/A converter 406 to increase or decrease the supply Vdd and/or body bias Vbb voltages. So, for example, if the clock edge of the delayed version of the CLK signal lags the clock edge of the CLK signal, the decoder 304, in response to the phase detect signal from the phase detect circuit 302, provides a signal having a value that causes the D/A converter 306 to increase the supply voltage Vdd. The increased supply voltage Vdd is fed back to the supply input connections of the reference CP circuit 301. The increased supply voltage has the effect of shortening the time it takes for the delayed version of the CLK signal to pass through the reference CP circuit 301, thereby reducing the lag time. Conversely, if the clock edge of the delayed version of the CLK signal leads the clock edge of the CLK signal, the decoder 304 provides a signal having a value that causes the D/A converter 306 to reduce the supply voltage Vdd. The reduced supply voltage Vdd is fed back to the supply input connections of the reference CP circuit 301 and has the effect of increasing the time it takes for the delayed version of the CLK signal to pass through the reference CP circuit 301, thereby reducing the lead time. The body bias voltage Vbb can be similarly adjusted to assist in reducing the lead and lag times. The feedback mechanism of the DLL operates in this manner until the relative delay between the CLK signal and the delayed CLK signal is a multiple of the CLK signal period (i.e., until the DLL locks) and, consequently, the appropriate Vdd and/or Vbb voltages for the frequency of the applied CLK signal are determined. By applying different frequency CLK signals, corresponding Vdd and/or Vbb voltages necessary for the FPGA 100 to perform at the different CLK frequencies can be determined and recorded.

While the performance monitor circuit 300 above is described in terms of determining and recording values of Vdd and/or Vbb for various known CLK signal frequencies applied to the circuit 300, minor modifications to the circuit 300 allow the measurement of the performance (i.e., CLK frequency) for various known and applied Vdd and/or Vbb voltages. According to this alternative embodiment the performance monitor circuit 300 is configured in an open loop fashion, and the CP circuit 301 is configured to operate, for example, as a ring oscillator. The appropriate CLK speed for each of the various known and applied Vdd and/or Vbb voltages can then be determined and recorded by measuring the phase difference at the output of the phase detect circuit 302.

Figure 4:
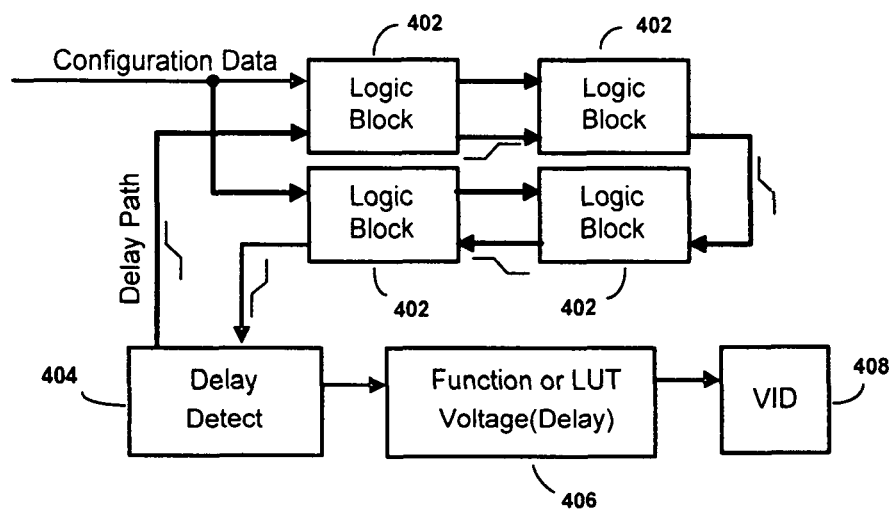
FIG. 4 is diagram illustrating how basic logic or circuit building blocks of a programmable logic device such as, for example, the FPGA 100 in FIG. 1, may be used to form a delay path that determines the appropriate voltage settings (i.e., Vdd and/or Vbb) and corresponding VID codes necessary for the programmable logic device to operate at a desired performance level, according to an embodiment of the present invention.

According to another embodiment, shown in FIG. 4, the logic structures that form the building blocks of the FPGA 100 are used to form a delay path, which is then used to determine the Vdd and/or Vbb settings needed to operate that FPGA 100 at a desired performance (e.g, operating speed). In this embodiment, the logic blocks 402 correspond to logic structures an end user would use to configure a design, or to logic already configured in a design. A series of configuration bits are used to define the logical function(s) of the logic block(s) and/or the connectivity of the block(s) internally or externally in relation to other logic blocks. One or more paths are defined through the logic blocks 402, and a delay detect circuit 404 is used to determine and/or monitor the delay of a signal through the one or more paths. A function or LUT voltage (delay) block 406 operates to translate the delay determined by the delay detect circuit 404 into VID codes 408, which are used by the voltage regulator module 108 to generate Vdd and/or Vbb.

Figure 5:
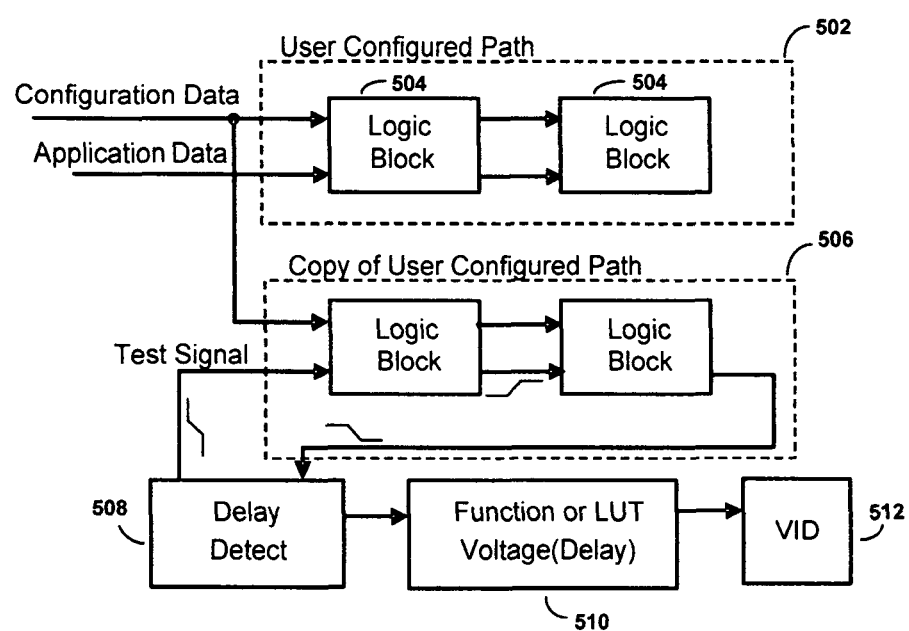
FIG. 5 is diagram illustrating how a copy or duplicate of a user-configured path of a programmable logic device such as, for example, the FPGA 100 in FIG. 1, may be used to form a delay path that determines the appropriate voltage settings (i.e., Vdd and/or Vbb) and corresponding VID codes necessary for the programmable logic device to operate at a desired performance level, according to an embodiment of the present invention.

FIG. 5 shows another embodiment in which a copy or duplicate 506 of a user-configured logic path 502, which is comprised of a plurality of logic blocks 504, is used to form a delay path. A delay circuit 508 is used to determine and/or monitor the delay through the duplicate delay path 506. A function or LUT voltage (delay) block 510 operates to translate the delay into VID codes 512 for the voltage regulator module 108 to generate Vdd and/or Vbb. One advantage of this embodiment is that factors affecting the performance of the FPGA 100 (e.g., temperature, aging of the device, power droop) can be compensated for without the delay determination interfering with the operation of the user-configured logic path 502.

Figure 6:
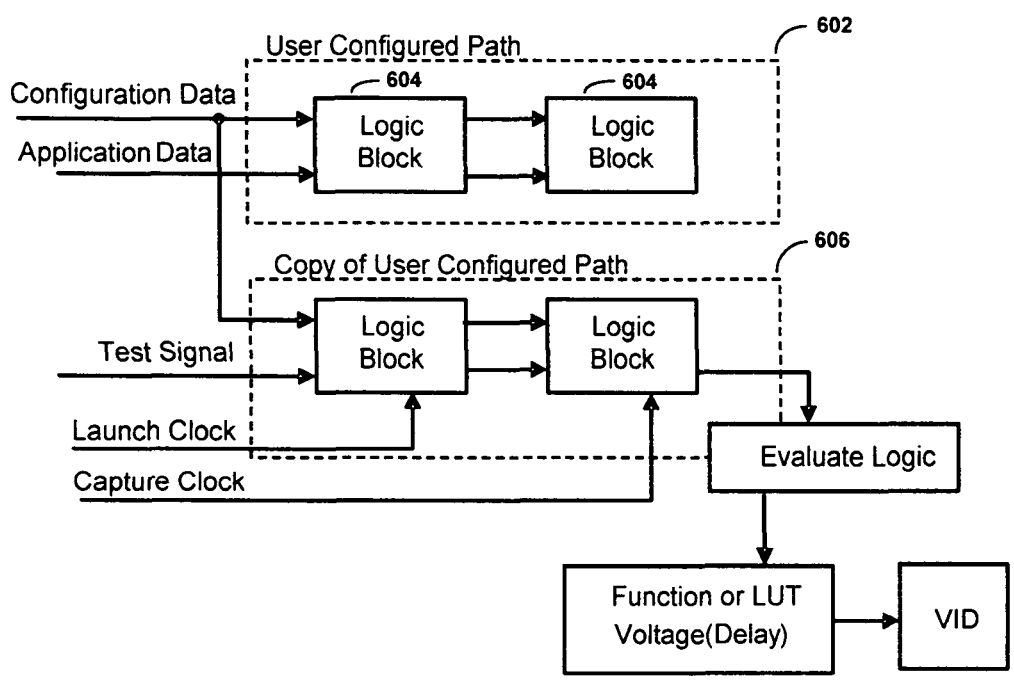
FIG. 6 is diagram illustrating how the delay of either a manufacturer or user-defined logic path is determined using launch and capture clocks, in accordance with embodiments of the present invention.

While the above described performance monitor circuits may be configured to employ a DLL or ring oscillator to form a delay path, in an alternative embodiment, shown in FIG. 6, clocks or launch-capture pulses are used to determine and/or monitor the delay of a logic path. According to this embodiment, a launch clock signal is used to launch the propagation of a test signal through a user-configured logic path 602 comprised of one or more logic blocks 604, or through a copy or duplicate 606 of the user-configured logic path 602 (as shown in FIG. 6). Another clock, which may be derived from the same clock source as the launch clock, is used to determine when the test signal has passed through duplicate logic path 606. The capture clock is used to store the measured data into a memory element, or is used to generate a compare trigger. If stored in a memory element, the stored data is evaluated through some other means and compared to the data of the test signal to determine whether there is a match. This is a preferred method in most cases, given that the memory element is typically a pre-existing structure and, therefore, little added circuitry is needed. If the capture clock is used to generate a compare trigger, the test signal is directly evaluated using the capture clock as a trigger for a compare circuit to check the output of the duplicate logic path 606 for the expected results. Any one of a number of suitable methods may be employed to determine the delay. According to one approach, the capture clock is started from a point where the capture edge is smaller than the delay in linear steps until the capture clock edge is sufficiently delayed from the launch clock edge to capture the correct test signal.

Figure 7:
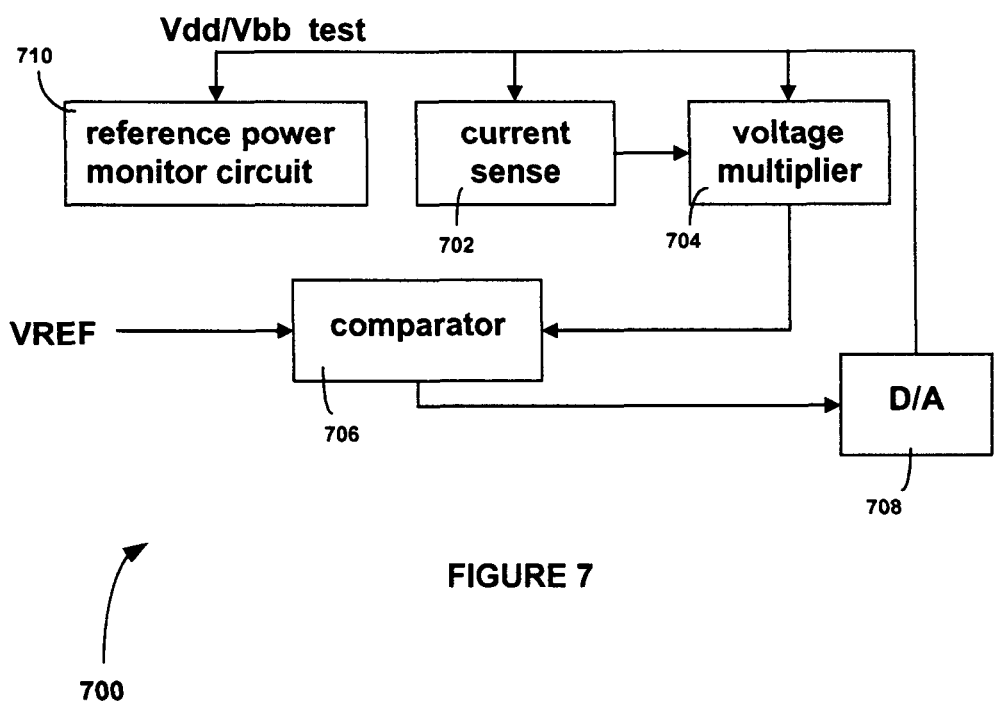
FIG. 7 is a diagram of an exemplary power monitor circuit, which may be used to implement the power monitor circuit of the management module circuit in FIG. 2, in accordance with an embodiment of the present invention.

FIG. 7 is a drawing of an exemplary power monitor circuit 700, which may be used to implement the power monitor circuit 204 of the management module circuit 200 in FIG. 2. The power monitor circuit 700 comprises a current sensor 702, a voltage multiplier 704, a comparator 706, and a D/A converter 708. Current through a reference power monitor circuit 710 is detected by the current sensor 702 and translated into an analog voltage, e.g., by a voltage drop across a small resistor. Power consumption is calculated by the voltage multiplier 704 and compared by the comparator 706 to a reference voltage VREF representing a predetermined desired power consumption. The D/A converter 708 receives an output signal from the comparator 706 and generates the resulting voltages (i.e., Vdd and/or Vbb) necessary to meet the power requirement defined by the reference voltage VREF. Application of the power monitor circuit 700 to various known values of VREF allows corresponding Vdd and/or Vbb voltages to be determined and recorded.

While the power monitor circuit 700 above is described in terms of determining and recording Vdd and/or Vbb values for various known VREF values applied to the circuit 700, the circuit 700 may be modified so that it operates in an open loop fashion. When configured in this manner, direct power measurement as functions of supply Vdd and/or body bias Vbb voltages can be determined and recorded.

According to an aspect of the invention, the performance and power monitor circuits described above may be utilized by a manufacturer or tester of the FPGA 100 to generate the performance and power tables for the FPGA 100. For example, during testing, various predetermined CLK frequencies and voltage reference values are applied to inputs of the FGPA to determine the corresponding Vdd and/or Vbb voltages that need to be generated and applied by the voltage regulator module 108 in order to satisfy particular performance and/or power requirements. FIG. 8 shows an exemplary performance/power table as functions of Vdd and Vbb, which may be generated using one of the performance and power monitor circuits described above. While the table entries in FIG. 8 are shown as being generated and recorded in terms of Vdd and Vbb, alternatively the entries may be generated (e.g., during manufacture testing or self generated by the performance and power monitor circuits 202, 204) and recorded in the table as terms which one or more equations may access to determine the appropriate Vdd and/or Vbb settings needed for a given power and/or performance requirement.

According to an aspect of the invention, VID codes corresponding to the performance and power information determined by the test or self-generating methods described above may be stored either inside the FPGA 100 or in a memory external to the FPGA 100. The VID codes are used to generate the appropriate VID signals for the voltage regulator module 108, which as explained above generates and provides the required supply Vdd and/or body bias Vbb voltages to the FGPA 100 necessary to ensure that the FPGA 100 operates according to the selected performance and power criteria. If stored external to the FPGA 100, one or more VID codes corresponding to the required supply Vdd and/or body bias Vbb voltage levels can be determined in advance according to design requirements provided by an end user of the FPGA 100. The manufacture or tester can then write the appropriate VID codes into storage elements of the FPGA 100 to ensure that the appropriate Vdd and/or Vbb voltage levels necessary to satisfy the design requirement are generated and applied during operation.

Figure 9:
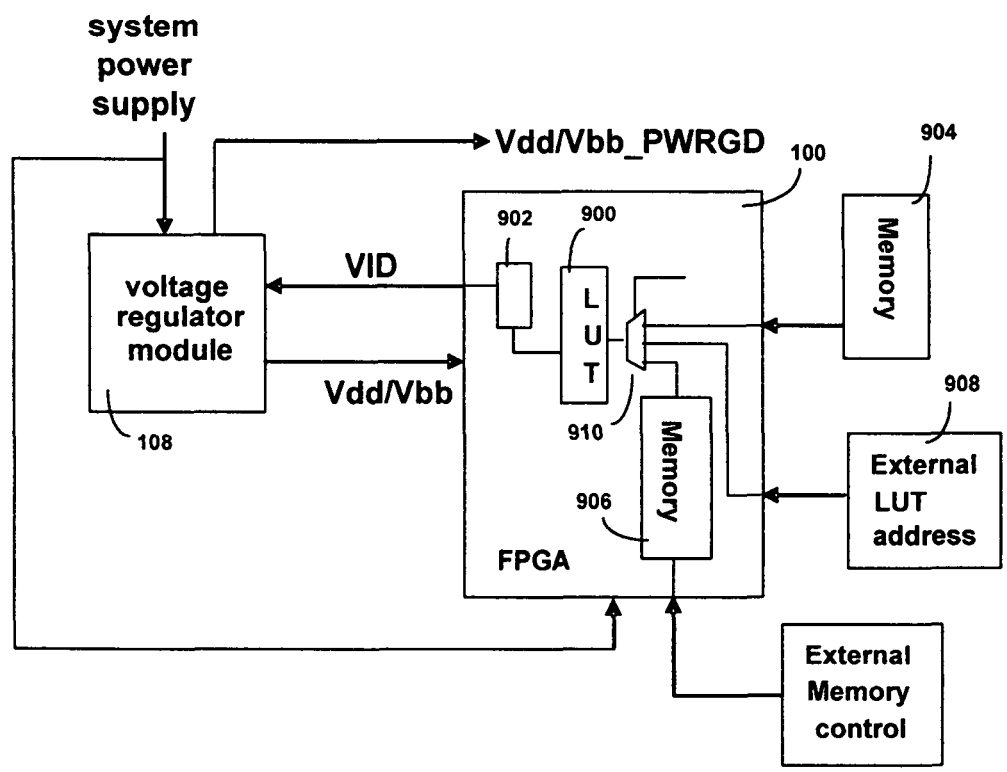
FIG. 9 is a diagram of an exemplary embodiment of the system in FIG. 1 in which VID codes are contained within a LUT, in accordance with an embodiment of the present invention.

The VID codes may also be configured within a lookup table (LUT) or written into storage registers or a LUT of the FPGA 100 in the field, e.g., by way of a preconfiguration stream in a configuration memory. FIG. 9 shows an embodiment of the system in FIG. 1 where VID codes are contained within a LUT 900. The VID codes contained in the LUT 900 provide the N VID digital control codes to the voltage regulator module 108, via FPGA output registers 902, and may be defined by an internal memory 906 or a memory 904 external to the FPGA 100. The VID codes may also be referenced by either addresses provided by an internal source or memory or by addresses provided by an external LUT address 908 such as, for example, a memory or input/output (I/O) device. Further, these various possible reference sources may be used alone or in combination, depending on design requirements and/or the level of flexibility desired from a user. To afford this flexibility a multiplexer 910 having a select input that is controllable by the user, may be provided.

Figure 10:
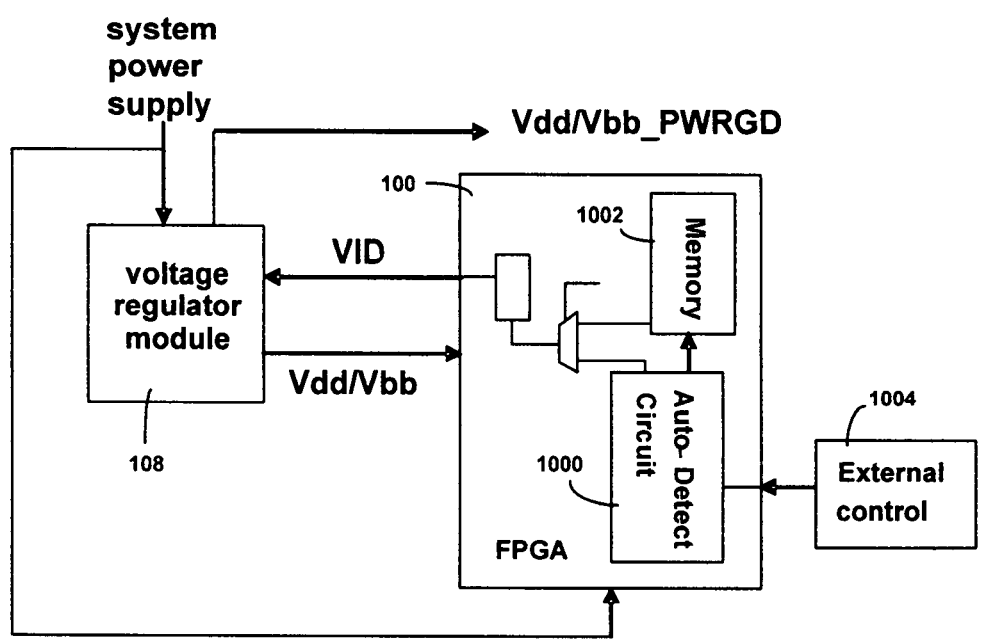
FIG. 10 is a diagram of an exemplary embodiment of the system in FIG. 1 where the VID codes are provided from an auto-detect circuit, in accordance with an embodiment of the present invention.

FIG. 10 shows an alternative embodiment of the system in FIG. 1 where the VID codes are provided directly from an auto-detect circuit 1000, which determines the performance and power characteristics of the FPGA 100 using circuitry similar to the performance and power monitoring circuitry described above. According to this embodiment of the invention, various values of the CLK signal frequency and VREF are internally generated by circuitry within the FPGA 100, rather than by applying various CLK signal frequencies and VREF voltages to pins external to the FPGA 100. Vdd, Vbb and/or VID values are then determined and recorded for each of the internally generated CLK signal frequencies and VREF values. The power and performance table in the FPGA 100 can be periodically updated, even after the FPGA 100 has been delivered to a customer and/or configured for operation. So, for example, power and performance changes of the FPGA 100, together with associated VID codes, may be periodically updated by generating new power performance table entries as the FPGA 100 ages over its lifetime. While the VID codes have been described as being directly generated by the auto-detect circuit 1000, those of ordinary skill in the art will readily appreciate and understand that the auto-detect circuit 1000 may be alternatively configured to drive a memory element 1002 that provides the VID codes. Further, the auto-detect circuit and/or generation of VID codes can be fully self-contained within the FPGA 100, or may be directed and controlled by an external control 1004, as shown in FIG. 10.

Figure 11:
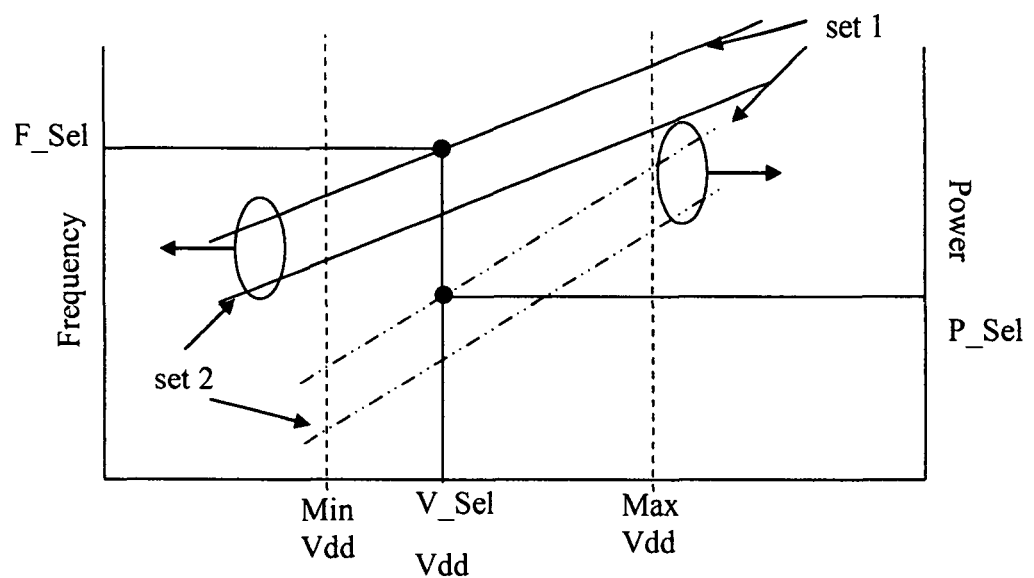
FIG. 11 is a power/performance graph illustrating how a user or customer would map a design requirement onto the device characteristics of a programmable logic device having predetermined power and performance characteristics, in accordance with an embodiment of the present invention.

While a VID code can be preset based on an end user's design requirements, one or more VID codes corresponding to different power and performance capabilities can alternatively be written into the FPGA 100 (e.g., in the FPGA's storage registers) during testing or manufacturing independent of any particular design criteria. A user or customer can then select the particular power and/or performance characteristics of the FPGA 100 necessary to satisfy a particular design. FIG. 11 is a power/performance graph illustrating how a user or customer would "map" a design requirement onto the device characteristics of an FGPA having predetermined power and performance characteristics. The power and frequency (i.e., performance) curves represent the guaranteed power and performance characteristics of an FPGA delivered to the user or customer, e.g., in the form of a data sheet. Although not required, as shown in FIG. 11 the power/performance graph may contain multiple sets of power and performance curves (identified as "set 1" and "set 2" in FIG. 11). One set of power and performance curves corresponds to a particular classification of FPGA provided by the manufacturer, designer, tester or distributor, while other sets represent the power and performance characteristics of other classifications. So, for example, parts having characteristics curves that fall between the upper and lower power lines or above the upper performance line would use the upper lines. Parts having characteristic curves lie below the lower power line or fall between the upper and lower performance lines would use the lower lines. This guarantees that all parts in a designated class fall on the corresponding curve, or perform better than the characteristics defined by the curve.

Using the power/performance graph for an FPGA having a known classification allows a user to decide either what frequency or power or frequency/power combination to use for a particular application. For example, by selecting the minimum requirements for either power or frequency or both from the appropriate curves, a specific supply voltage Vdd at which the part will properly operate can be obtained. Similar curves can be provided to determine the proper body bias voltage Vbb. By storing VID codes associated with the selected supply Vdd and/or body bias Vbb voltage in storage elements of the FPGA 100, the FPGA 100 can then transmit corresponding VID codes to the voltage regulator 108. In this manner a user can obtain individual supply Vdd and/or body bias Vbb voltages and optimize performance and power per individual part.

Although the present invention has been described with reference to specific embodiments thereof, these embodiments are merely illustrative, and not restrictive, of the present invention. Additionally, various modifications or changes to the specifically disclosed exemplary embodiments will be suggested to persons skilled in the art and are to be included within the spirit and purview of this application and scope of the appended claims.

What is claimed is:

1. A system for setting and controlling the power level and operating frequency of a programmable logic device, comprising:
    a programmable logic device having a plurality of reconfigurable digital circuits and operable to provide a plurality of voltage identification (VID) codes corresponding to a plurality of power levels and operating frequencies at which said programmable logic device can be set to operate, wherein said programmable logic device includes a performance monitor circuit operable to determine performance of said programmable logic device in accordance of a supply voltage and a body bias voltage; and
    a voltage regulator module operable to generate a supply voltage and a body bias voltage, based on one or more of said plurality of VID codes, and provide the generated said supply voltage and said body bias voltage to a supply input and a body bias input of said programmable logic device,
    wherein said performance monitor circuit is operable to determine supply and body bias voltage values to be applied to the programmable logic device in order to operate the programmable logic device at a particular clock frequency, said determined supply and body bias voltage values corresponding to one or more VID codes of said plurality of VID codes, and wherein said programmable logic device comprises a field programmable gate array (FPGA).

2. The system of claim 1 wherein said programmable logic device includes a lookup table (LUT) that is operable to provide said plurality of VID codes.

3. The system of claim 2 wherein said LUT is adapted to be addressable by an addressing source that is integrated with the programmable logic device.

4. The system of claim 3 wherein said LUT is adapted to be addressable by an addressing source that is external to the programmable logic device.

5. The system of claim 1 wherein said performance monitor circuit includes a delay path having one or more logic blocks in which a user's design is configured.

6. The system of claim 1 wherein said performance monitor circuit includes a delay path including at least one logic block that is a duplicate of a logic block configured in a user's design.

7. The system of claim 1 wherein said programmable logic device contains a power monitor circuit operable to determine supply and body bias voltage values to be applied to the programmable logic device in order to operate the programmable logic device at a particular power level, said determined supply and body bias voltage values corresponding to one or more VID codes of said plurality of VID codes.

8. The system of claim 7 wherein the programmable logic device includes a memory or a table configured to store said performance and/or power data.

9. The system of claim 1 wherein said programmable logic device contains a performance circuit and a power monitor circuit, which are used to determine supply and body bias voltage values to be applied to the programmable logic device in order to operate the programmable logic device at a particular combination of power and clock frequency, said determined supply and body bias voltage values corresponding to one or more VID codes of said plurality of VID codes.

10. The system of claim 1 wherein the programmable logic device includes performance and/or power monitor circuitry operable to generate performance and/or power data for use by one or more equations to generate said plurality of VID codes.

11. The system of claim 1 wherein said VID codes are generated based on performance and/or power data measured from tests performed on said programmable logic device.

12. The system of claim 1 wherein said programmable logic device contains performance and/or power monitoring circuits that dynamically monitor and generate correction data for compensating for deviations in performance and/or power of the programmable logic device during operation.

13. The system of claim 12 wherein said correction data relates to degradation in performance and/or power operating characteristics of the programmable logic device as the programmable logic device ages.

14. The system of claim 1 wherein the programmable logic device includes user accessible circuitry adapted to provide a user the ability to define a combination of power and performance at which the programmable logic device operates.

15. The system of claim 1 wherein said programmable logic device and said voltage regulator module are configured to respond to a user defined combination of power and performance to determine values of the supply and/or body bias voltages, which when applied to the programmable logic device result in the programmable logic device operating according to the user defined combination of power and performance.

16. The system of claim 1 wherein the programmable logic device includes user accessible circuitry that allows a user to define a power or performance operating level of the programmable logic device.

17. The system of claim 1 wherein one or more of said plurality of VID codes are configured within said programmable logic device during a time when the programmable logic device is being tested or manufactured.

18. The system of claim 1 wherein said plurality of VID codes are derived from a preconfiguration data stored in an external configuration memory.

19. The system of claim 1, further comprising means for providing a user the ability to select which of the VID codes of said plurality of VID codes are used by said voltage regulator module to generate said supply and/or body bias voltage.

20. The system of claim 19 wherein said user selects a VID code based on data provided by a manufacturer, tester, designer or distributor of the programmable logic device.

21. The method of setting the power and performance characteristics of a field programmable gate array (FPGA), comprising:
generating power and performance data characterizing the operating frequency and power consumption of an integrated circuit using power and performance monitor circuitry integrated within said integrated circuit;
storing a plurality of voltage identification (VID) codes associated with said power and performance data in said integrated circuit, said VID codes corresponding to different a supply voltage and a body bias voltage;
selecting a VID code from said stored plurality of VID codes;
providing a VID signal corresponding to said selected VID code to a VID input port of a voltage regulator module;
determining a supply voltage and a body bias voltage by said performance monitor circuitry in accordance with one or more VID code of said plurality of VID codes;
applying said supply voltage and said body bias voltage to said FPGA for operating the FPGA at a particular power level;

coupling said supply voltage and said body bias voltage generated by said voltage regulator module to power supply and body bias inputs of said integrated circuit, based on said VID signal; and
monitoring performance of the integrated circuit in accordance of said supply voltage and said body bias voltage.

22. The method of claim 21 wherein selecting a VID code from said stored plurality of VID codes is controllable by a user.

23. The method of claim 22 wherein the user controls selection of the VID code based on a desired power consumption of the integrated circuit.

24. The method of claim 22 wherein the user controls selection of the VID code based on a desired performance characteristics of the integrated circuit.

25. The method of claim 22 wherein the user controls selection of the VID code based on a desired combination of power and performance of the integrated circuit.

26. The method of claim 25 wherein said desired combination of power and performance is derived from power and performance data provided by a manufacturer, tester, designer or distributor of said integrated circuit.

27. The method of claim 21 wherein said integrated circuit comprises a field programmable gate array (FPGA) and storing plurality of VID codes comprises storing said VID codes in storage registers of said FPGA.

28. The method of claim 21 wherein storing said VID codes comprises configuring said VID codes within a lookup table (LUT).

29. A method of setting operating characteristics of a field programmable gate array (FPGA), comprising:
programming said integrated circuit to perform a selected logic function;
storing a plurality of voltage identification (VID) codes corresponding to a plurality of supply voltages and a plurality of body bias voltages in said integrated circuit;
selecting a VID code from said stored plurality of VID codes;
providing a VID signal corresponding to said selected VID code to a VID input port of a voltage regulator module;
coupling a supply voltage and a body bias voltage generated by said voltage regulator module to power a supply input and a body bias input of said integrated circuit based on said VID signal;
determining said supply voltage and said body bias voltage by said performance monitor circuitry in accordance with one or more VID code of said plurality of VID codes;
applying said supply voltage and said body bias voltage to said FPGA for operating the FPGA at a particular power level; and
monitoring performance of the integrated circuit in accordance of said supply voltage and said body bias voltage,
wherein said stored VID codes are derived from an electrical device that is external to said integrated circuit.

30. The method of claim 29 wherein said integrated circuit comprises a programmable logic device.

31. The method of claim 30 wherein said programmable logic device comprises a field programmable gate array (FPGA).

32. The method of claim 30, further comprising transferring VID codes configured within a preconfiguration stream of an external configuration memory to said programmable logic device.

33. The method of claim 29 wherein selecting a VID code from said stored plurality of VID codes is controlled by a user.

34. The method of claim 33 wherein said user controls selecting the VID code based on frequency and power characteristics provided by a manufacturer, tester, designer or distributor of the integrated circuit.

35. A programmable logic device having a plurality of reconfigurable digital circuits, comprising:
  a lookup table (LUT) adapted to provide a first VID signal and a second VID signal selected from among a plurality of available VID signals;
  a performance monitor circuit operable to determine performance of said programmable logic device in accordance of a supply voltage and a body bias voltage; and
  means for providing an address to inputs of said LUT to select said VID signal,
  wherein said first VID signal is used by a voltage regulator module to generate a supply voltage, which is applied to a supply input of the programmable logic device, said supply voltage having a value that corresponds to a predetermined power level of said programmable logic device,
  wherein body bias voltages are generated by said voltage regulator module in response to said second VID signal;
  wherein said performance monitor circuit applies said supply and body bias voltage values to the programmable logic device in order to operate the programmable logic device at a particular clock frequency, said determined supply and body bias voltage values corresponding to one or more VID codes of said plurality of VID codes, and wherein said programmable logic device includes a field programmable gate array (FPGA).

36. The programmable logic device of claim 35 wherein said means for providing an address to inputs of said LUT comprises a memory integrated within the programmable logic device.

37. The programmable logic device of claim 35 wherein said means for providing an address to inputs of said LUT comprises a memory that is external to said programmable logic device.

38. The programmable logic device of claim 35, further comprising means for allowing a user of said programmable logic device to select and control which one of said plurality of VID signals is provided to said voltage regulator module.

39. A programmable logic device having a plurality of reconfigurable digital circuits, comprising:
  a circuit operable to determine power consumption levels of said programmable logic device depending on values of a power supply applied to said programmable logic device;
  a performance monitor circuit operable to determine performance of said programmable logic device in accordance of a supply voltage and a body bias voltage; and
  means for generating a plurality of voltage identification (VID) codes from data generated from said circuit's determination of power consumption levels of said programmable logic device; and
  means for selecting a VID code from said plurality of VID codes,
  wherein said selected VID code is used by a voltage regulator module to generate a power supply voltage and a body bias voltage for said programmable logic device;
  wherein said performance monitor circuit applies said supply and body bias voltage values to the programmable logic device in order to operate the programmable logic device at a particular clock frequency, said determined supply and body bias voltage values corresponding to one or more VID codes of said plurality of VID codes, and wherein said programmable logic device includes a field programmable gate array (FPGA).

40. The programmable logic device of claim 39 wherein said circuit is further operable to characterize the power consumption levels of said programmable logic device depending on values of a body bias voltage applied to said programmable logic device.

41. The programmable logic device of claim 39 wherein said circuit is further operable to determine operating frequencies of said programmable logic device depending on values of a power supply applied to said programmable logic device.

42. The programmable logic device of claim 41 wherein said circuit is further operable to characterize the operating frequency of said programmable logic device depending on values of a body bias voltage applied to said programmable logic device.

43. The programmable logic device of claim 39, further comprising means for allowing a user to control which VID code of said plurality of VID codes is selected.

* * * * *